United States Patent [19]
Solie

[11] Patent Number: 5,818,310
[45] Date of Patent: Oct. 6, 1998

[54] SERIES-BLOCK AND LINE-WIDTH WEIGHTED SAW FILTER DEVICE

[75] Inventor: Leland P. Solie, Apopka, Fla.

[73] Assignee: Sawtek Inc., Orlando, Fla.

[21] Appl. No.: 703,671

[22] Filed: Aug. 27, 1996

Related U.S. Application Data

[63] Continuation-in-part of Ser. No. 529,238, Sep. 15, 1996.
[51] Int. Cl.$^6$ .............................. H03H 9/64; H03H 9/145
[52] U.S. Cl. .................. 333/196; 310/313 C; 310/313 B
[58] Field of Search ..................................... 333/193–196; 310/313 R, 313 B, 313 C, 313 D

[56] References Cited

U.S. PATENT DOCUMENTS

| | | | |
|---|---|---|---|
| 3,675,054 | 7/1972 | Jones et al. .......................... | 310/313 B |
| 3,870,975 | 3/1975 | Vasile . | |
| 4,114,116 | 9/1978 | Reeder . | |
| 4,162,465 | 7/1979 | Hunsinger et al. .................. | 333/194 X |
| 4,203,082 | 5/1980 | Tsukamoto et al. . | |
| 4,316,161 | 2/1982 | Moore et al. . | |
| 4,321,567 | 3/1982 | Sandy ....................................... | 333/196 |
| 4,321,696 | 3/1982 | Kanda . | |
| 4,331,840 | 5/1982 | Murphy et al. . | |
| 4,348,904 | 9/1982 | Bautista, Jr. . | |
| 4,384,264 | 5/1983 | Kadota ..................................... | 333/193 |
| 4,449,107 | 5/1984 | Asai et al. . | |
| 4,480,209 | 10/1984 | Okamoto et al. . | |
| 4,486,724 | 12/1984 | Schofield . | |
| 4,516,049 | 5/1985 | Mikoshiba et al. . | |

(List continued on next page.)

FOREIGN PATENT DOCUMENTS

| | | |
|---|---|---|
| 56-10724 | 2/1981 | Japan . |
| 60-180316 | 9/1985 | Japan . |
| 61-220509 | 9/1986 | Japan . |

OTHER PUBLICATIONS

"Weighting Interdigital Surface Wave Transducers by Selective Withdrawal of Electrodes," C.S. Hartmann, Texas Instruments Incorporated, *1973 Ultrasonics Symposium Proceedings*, pp. 423–426.

"Capacitive Tap Weighted SAW Transducers," D.C. Malocha and Bill J. Hunsinger, *IIEE Transactions on Sonics and Ultrasonics*, vol. SU–24, No. 5, Sep. 1977, pp. 293–301.

"Matching of Single–Phase Unidirectional SAW Transducers and a Demonstration Using a Low–Loss EWC/SPUDT Filter," B.P. Abbott, C.S. Hartmann, and D.C. Malocha, University of Central Florida, *1990 Ultrasonics Symposium Proceedings*, pp. 49–54.

"Wide Band Linear Phase SAW Filters Using Apodized Slanted Finger Transducers," P.M. Naraine and C.K. Campbell, Ontario, Canada, *1983 Ultrasonics Symposium Proceedings*, pp. 113–116.

"Improved Design of Single–Phase Unidirectional Transducers for Low–Loss Saw Filters," C.B. Saw and C.K. Campbell, Microwave Acoustics Laboratory, Dept. of Electrical and Computer Eng., McMaster Univ., Hamilton, Ont., Canada L8S 4L7 *1987 Ultrasonics Symposium Proceedings*, Oct. 14–16, 1987, pp. 169–172.

*Primary Examiner*—Robert J. Pascal
*Assistant Examiner*—Barbara Summons
*Attorney, Agent, or Firm*—Allen, Dyer, Doppelt, Milbrath & Gilchrist, P.A.

[57] ABSTRACT

Surface acoustic wave (SAW) filter performance is enhanced using series-block weighting and line-width weighting combined for providing a transducer having a finely adjusted uniform weighting across the beam profile. Such a transducer permits practical transducer pairing within a surface acoustic wave filter, as well as use with transducers requiring uniform weighting, such as transducers employing apodized weighting. A three electrode per wavelength transducer electrode finger geometry includes line-width weighting for providing a fine weighting control to complement the inherently coarse weighting control of the series-block weighted transducer. Selected transducer geometries including three electrode per wavelength structures are employed for use in wide band tapered electrode finger SAW devices.

16 Claims, 6 Drawing Sheets

U.S. PATENT DOCUMENTS

| | | |
|---|---|---|
| 4,600,905 | 7/1986 | Fredricksen .......................... 333/193 X |
| 4,602,228 | 7/1986 | Yamada . |
| 4,625,184 | 11/1986 | Niitsuma et al. . |
| 4,635,008 | 1/1987 | Solie . |
| 4,672,592 | 6/1987 | Skinner . |
| 4,746,882 | 5/1988 | Solie . |
| 4,767,198 | 8/1988 | Solie et al. . |
| 4,908,542 | 3/1990 | Solie . |
| 4,973,875 | 11/1990 | Yatsuda . |
| 5,075,652 | 12/1991 | Sugai . |
| 5,289,073 | 2/1994 | Mariani . |

SERIES-BLOCK AND LINE-WIDTH WEIGHTED SAW FILTER DEVICE

CROSS REFERENCE TO RELATED APPLICATION

This application is a continuation-in-part of pending application Ser. No. 529,238 filed Sep. 15, 1995 for a Weighted Tapered SPUDT Saw Device, commonly assigned with the present invention.

BACKGROUND OF INVENTION

1. Field of Invention

The invention relates generally to a surface acoustic wave (SAW) filter and more particularly to weighting of both input and output transducers for improved filtering for use in wideband and narrowband SAW devices.

2. Background Art

An electrical filter transmits signals having frequencies within certain designated ranges or passbands, and suppresses signals having other frequencies outside the passband or within attenuation bands. An ideal filter would transmit the signal within the passband without attenuation and completely suppress signals within the attenuation bands. Practical filters do attenuate the passband signal due to absorption, reflection, or radiation, which results in a loss of desired signal power. Further, such filters do not completely suppress signals within the attenuation bands. The use of surface acoustic wave (SAW) devices as filters or resonators is well known for having the advantages of high Q, low series resistance, small size, and good frequency temperature stability when compared to other frequency control methods such as LC circuits, coaxial delay lines, or metal cavity resonators. As is well known in the art, a SAW device typically contains a substrate of piezoelectric material such as quartz, lithium niobate, or zinc oxide. Input and output transducers are formed upon the substrate. The transducers convert input electrical signals to surface acoustic waves propagating upon the surface of the substrate and then reconvert the acoustic energy to an electric output signal. The input and output transducers are configured as interdigital electrode fingers which extend from pairs of transducer pads. Interdigital transducers may be formed by depositing and patterning a thin film of electrically conductive material upon the piezoelectric substrate.

Alternating electrical potential coupled to the input interdigital transducer induces mechanical stresses in the substrate. The resulting strains propagate away from the input transducer along the surface of the substrate in the form of surface acoustic waves. These propagating surface waves arrive at the output interdigital transducer where they are converted to electrical signals. Typical transducers will have a sin x/x passband shape which is not a preferred filter shape because its transition bandwidth is equal to the filter bandwidth, and more importantly, the first sidelobe is typically only 13 dB below the main response. To synthesize arbitrary passbands, transducer weighting is employed. Filtering is thus accomplished in the process of generating the surface acoustic wave by the input transducer and in the inverse process of detecting the wave by the output transducer. The most effective filtering will therefore be accomplished if both input and output transducers are weighted and thus participate in the filtering process. Common transducer weighting techniques include apodization and withdrawal weighting. Apodization is typically used for wideband filters and either apodization or withdrawal weighting typically used for narrowband filters.

Apodization varies the length of the electrodes to achieve an electrode weighting. With apodization, Fourier transform techniques can be readily applied for computing a filter impulse response when defining a spacial geometric pattern for the interdigital transducer fingers. It is well known that it is not practical to have an input apodized transducer launching a wave directly into an output apodized transducer because an apodized transducer launches a wave which has a non uniform beam profile, and as a receiving transducer, it must see a uniform beam profile. If a surface wave incident upon an apodized transducer is not uniform over the entire width of the beam, the frequency response will change dramatically. For this reason, apodized input and output transducers can not be used to form a filter unless an added structure such as a multi-strip coupler is used. The multistrip coupler positioned between the apodized input and output transducers transfers energy from a non uniform beam into an adjacent track in which a surface acoustic wave is launched as a uniform beam, and thus compatible with an apodized transducer receiving the uniform beam. However, using an apodized input transducer for generating a surface acoustic wave and transmitting the wave through a multi-strip coupler to an apodized output transducer widens the filter device thus requiring increased space within electronic systems seeking to be ever more miniaturized. Further, apodized transducer to apodized transducer through a multistrip coupler is only useful on high coupling substrates such as lithium niobate, whereas it is not practical on quartz. An unweighted transducer will also be used with an apodized transducer if less side lobe rejection can be tolerated for the system.

By way of example, a SAW filter design may require performance that an apodized transducer can provide yet places constraints on filter size or piezoelectric substrate type such that the use of a multistrip coupler is precluded. An alternative approach will often include the use of withdrawal weighting of one transducer with apodization of the other. A transducer having withdrawal weighting launches a uniform wave across the beam profile and thus is compatible with an apodized transducer. In withdrawal weighting techniques, electrode fingers are selectively removed, or withdrawn, from a uniform interdigital transducer having constant finger overlap in order to attain a desired transducer response. Since the remaining electrodes all have constant overlap, the withdrawal weighted interdigital transducer can be used with the apodized transducer, amplitude weighted, without the need for the multistrip coupler. Good sidelobe suppression can be obtained using this combination of overlap and withdrawal weighting. It is thus attractive for SAW transducers used on low-coupling piezoelectric substrates such as quartz, where the use of multi-strip couplers is normally impractical. However, since a filter approximation will deteriorate if too many electrodes are withdrawn, this technique is limited to narrowband filter applications where the number of interdigital transducer electrodes is large. Further, although the withdrawal weighted transducer satisfies the uniform wave condition, withdrawal weighting is a coarse weighting technique, and as a result produces generally poor far out sidelobe response with less than desirable noise rejection.

A weighting technique providing fine adjustments and the desirable uniform beam profile is needed.

SUMMARY OF INVENTION

In view of the foregoing background, it is therefore an object of the present invention to provide a transducer useful with narrow and wide passband SAW devices and which provides an improved performance over conventional filters. It is further an object of the present invention to provide a transducer that is useful in synthesizing passbands with fine tap weighting that has a uniform beam profile. Such a transducer can then be used in a SAW filter with an apodized transducer or with itself as an input and an output transducer, thus providing weighting in both input and output transducers of the filter. It is yet another object of the invention to provide a transducer capable of both coarse and fine weighting control that is uniform across the beam width.

These and other objects, features, and advantages of the invention are provided by combining series block weighting and line width weighting in a transducer that is used in a SAW filter wherein both input and output transducers are weighted for providing effective filtering. In one embodiment of the invention, a transducer is provided for a surface acoustic wave device which includes a piezoelectric substrate for propagating surface acoustic waves. The surface acoustic waves have a longitudinal axis of propagation across the device. The transducer is adapted for coupling to an electrical load and/or source. The transducer comprises one or several strings of subtransducers placed adjacent to each other in the same acoustic channel having substantially the same acoustic aperture. The subtransducer string is electrically connected in series and acoustically cascaded. Each subtransducer comprises corresponding bus bars and includes a plurality of interdigitized electrode fingers extending transversely to the propagation axis and inwardly from each bus bar for providing a relative weighting for the transducer. Additionally, at least some electrode fingers of the subtransducer have differing width dimensions for providing fine weighting control for the transducer.

BRIEF DESCRIPTION OF DRAWINGS

A preferred embodiment of the invention as well as alternate embodiments are described by way of example with reference to the accompanying drawings in which.

DETAIL DESCRIPTION OF PREFERRED EMBODIMENT

The present invention will now be described more fully hereinafter with reference to the accompanying drawings, in which preferred embodiments of the invention are shown. As illustrated, by way of example, with reference to the above related application, this invention may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
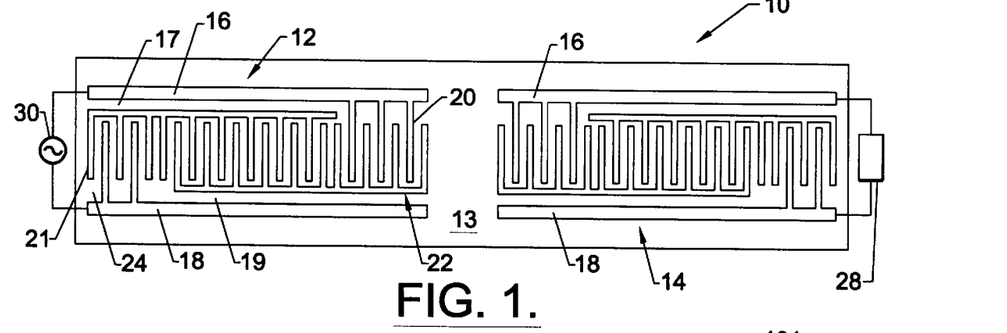
FIG. 1 is a partial plan view of a surface acoustic wave filter employing series block weighting.

Referring now initially to FIG. 1, a surface acoustic wave filter 10 includes an input transducer 12 and output transducer 14 deposited on a piezoelectric substrate 13. Each transducer 12, 14 comprises one or several strings of subtransducers 110, 112, 114, as illustrated by way of example with reference to FIG. 2. The string of subtransducers 110, 112, 114 includes a number of taps or electrode fingers 20, 21 within a wavelength in subtransducers 110, 112, 114 formed by the combination of outer bus bar fingers 20 and inner bus bar fingers 21 and their corresponding bus bars 16, 17, 18, 19, and finger electrode sets 20, 21, 22, 24, illustrated again with reference to FIGS. 1 and 2. The number of electrode fingers in each subtransducer vary so that the voltage applied to the string of subtransducers 110, 112, 114 is divided in such a manner as to weight the taps with respect to each other. The relative tap weight is proportional to the relative voltage applied to the tap.

As a point of interest, note that series subtransducers are described in U.S. Pat. Nos. 4,635,008 and 4,908,542 to Solie as a means of transforming the impedance of tapered transducers using strings of series connected transducers (called subtransducers). By way of the illustrated example, in this disclosure, each subtransducer had the same number of electrodes, so the voltage is divided equally between the subtransducers, and the voltage at every tap is the same. Therefore, there is no tap weighting, a distinguishing feature of the present invention.

Figure 2:
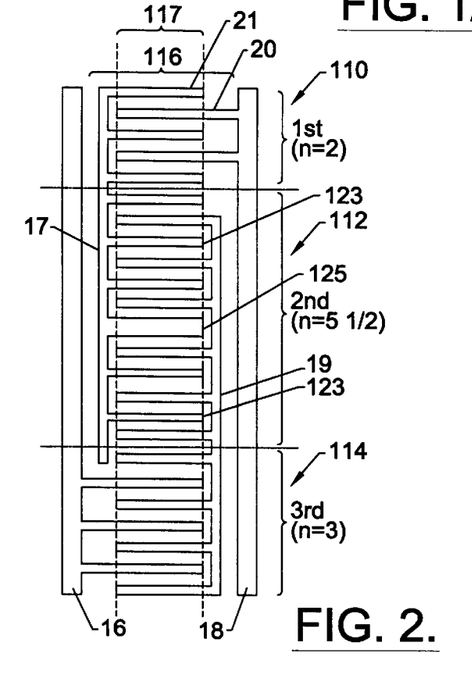
FIG. 2 is a partial plan view of a transducer of the present invention illustrating a subtransducer string structure for series-block weighting and line-width weighting of a transducer.
Figure 3:
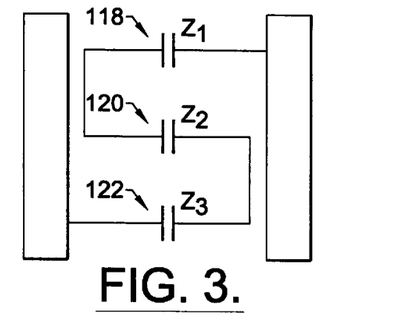
FIG. 3 is a schematic diagram illustrating an equivalent electrical circuit for the subtransducer geometry of FIG. 2.

With reference to FIG. 2, first note that the three subtransducers 110, 112, 114 are acoustically cascaded (share the same acoustic track or device aperture 116) and are electrically in series. If the impedance is dominated by capacitance, which is generally the case, the impedance of each subtransducer is inversely proportional to the number of the taps within that subtransducer. An equivalent circuit of this string of subtransducers 110, 112, 114 is illustrated with reference to FIG. 3, where capacitors 118, 120, 122, respectively, have values $z_1$, $z_2$ and $z_3$. Again with reference to FIG. 2, it can be seen that there are two taps in the first subtransducer 110, five and one-half in the second 112, and three in the third 114 An index "n" is the number of taps or wavelengths. Note that for this example, there are two electrode fingers 20, 21 per tap. There are two gaps per wavelength. If two adjacent fingers or electrodes are connected to the same bus bar, there is no voltage across that gap. Therefore, it is not counted as a gap for the purpose of counting taps per subtransducer. It follows, therefore that $z_1=z_0/2$, $z_2=z_0/5.5$ and $z_3=z_0/3$, where $z_0$ is a tap impedance specified over one wavelength. The outer bus bars 16, 18 are herein also referred to as major bus bars. By way of example, if we define the voltage or tap weight across the major bus bars 16, 18 as 1.0, then the tap weights in the three subtransducers 110, 112, 114 are herein calculated by simple voltage division as $t_1$, $t_2$, and $t_3$, where:

$$t_1 = \frac{1/2}{1/2 + 1/5.5 + 1/3} = .508$$

$$t_2 = \frac{1/5.5}{1/2 + 1/5.5 + 1/3} = .185$$

$$t_3 = \frac{1/3}{1/2 + 1/5.5 + 1/3} = .338$$

Assuming all the tap electrodes or fingers are identical, the taps within a subtransducer all have the same weight and are a block of taps of the same strength. For one preferred embodiment, there are several strings in a transducer and often they are constructed symmetrically about the center of a transducer. A string may consist of one subtransducer, in which case there is no voltage division and all taps in this string have a tap weight of unity.

An advantage of block weighting is the uniformity of weighting across the SAW aperture and that it can be achieved with a single layer metalization. The disadvantages are that the taps cannot be individually weighted, and the possible tap weight values are somewhat limited (i) by the fact that the sum of the tap weights across the subtransducers of a string must be one, and (ii) by the constraints of setting the impedances by the number of taps. Nonetheless, block weighting provides a useful technique for use in the present invention. It can therefore be said that block-weighting provides coarse or quantized tap weights.

Figure 4:
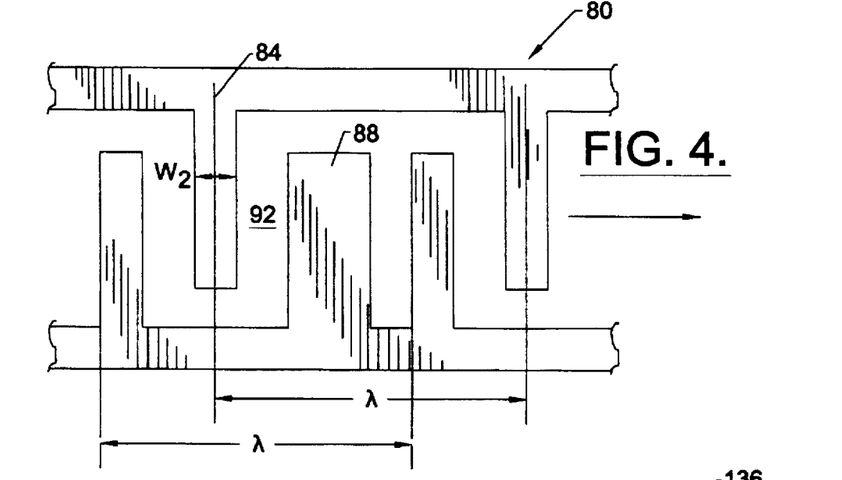
FIG. 4 is a partial exploded plan view of a transducer portion of an alternate embodiment of the present invention illustrating a three electrode per wavelength geometry.

In preferred embodiments of the present invention, weighting the taps includes varying the width of the electrode fingers 20, 21, as earlier described in the reference application and as will be herein again described. This is referred to as line-width weighting. Within a range of line-widths, as a selected electrode finger width 84, $w_2$, as illustrated with reference to FIG. 4, is increased, the tap weight or transduction strength of the tap is increased. This is valid for the range where w/λ (finger width to wavelength) is ≦0.4, and for most practical examples where w/λ≦0.25. The lower range of w/λ is limited by the line width that can be fabricated both on the device and on the mask. For lower frequency devices, this range of w/λ can be large enough to change the relative tap weight strength from 1.0 down to around 0.5, whereas at higher frequencies, the tap weight range will be much more limited. In general, it can be said that the range can not significantly approach zero and can only decrease somewhat from unity (relative tap weight). This line-width weighting, however, is useful when combined with series-block weighting. Unlike line-width weighting techniques used in the past, limited because of limited tap weight range, when combined with series-block weighting, the achievable tap weight range is much broader. The two tap weighting techniques are complimentary when used together because block weighting is coarse weighting with a large range of tap weights and line width weighting is a fine weighting with a limited range (just enough to bridge a gap between the relatively large steps of the block weights).

Figure 5:
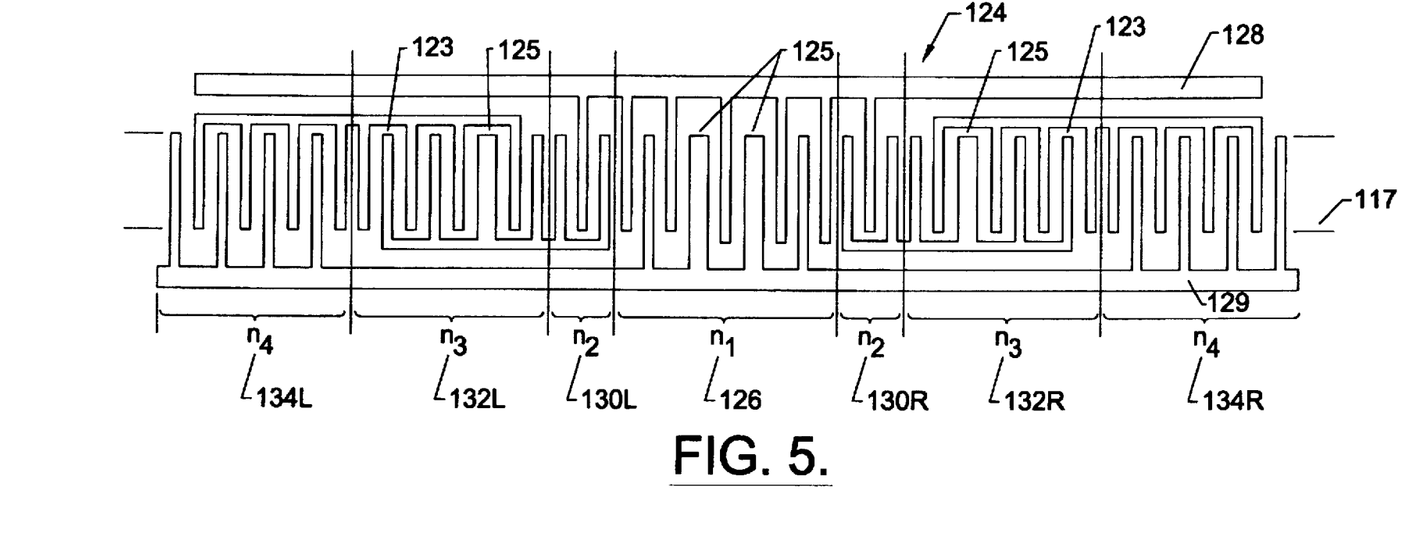
FIG. 5 is a partial plan view of a transducer having subtransducers implemented to provide series-block weighting in combination with line-width weighting.
Figure 6:
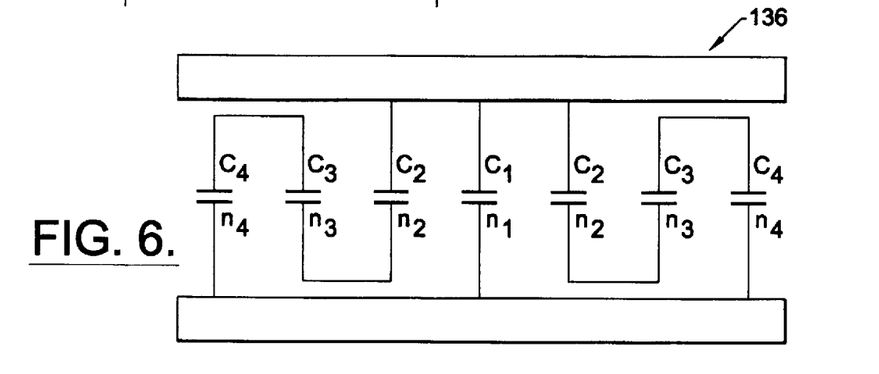
FIG. 6 is a schematic diagram illustrating an equivalent electrical circuit for the transducer structure of FIG. 5.

By way of example and with reference to FIG. 5, line-width weighting is used with series-block weighting to implement a Hamming weighted function. Again with reference to FIG. 5, consider the transducer 124 consisting of a set of taps ($n_1$) or main subtransducer 126 in the center that are directly connected to the primary (hot and ground) bus bars 128, 129 and a string of three subtransducers connected in a series symmetrically on each side 130L, 132L, 134L, 130R, 132R, 134R of the main subtransducer 126. Electrically the circuit 136 of the subtransducers (representing a transducer by a capacitor) is as shown in FIG. 6. The three subtransducers (130L–134R) in series on each side of the center subtransducer 126 will divide the voltage between them by normal voltage division. If the number of electrodes or fingers in the subtransducer is $n_1$, $n_2$, $n_3$ and $n_4$, as illustrated with reference to FIG. 5, the relative voltage across the center subtransducer is $a_1=1.0$ (full strength), and on #2 is:

$$a_2 = \frac{1/n_2}{1/n_2 + 1/n_3 + 1/n_4}$$

and on subtransducers #3 and #4 is $$a_3 = \frac{1/n_3}{1/n_2 + 1/n_3 + 1/n_4}$$

$$a_4 = \frac{1/n_4}{1/n_2 + 1/n_3 + 1/n_4}$$

Figure 7:
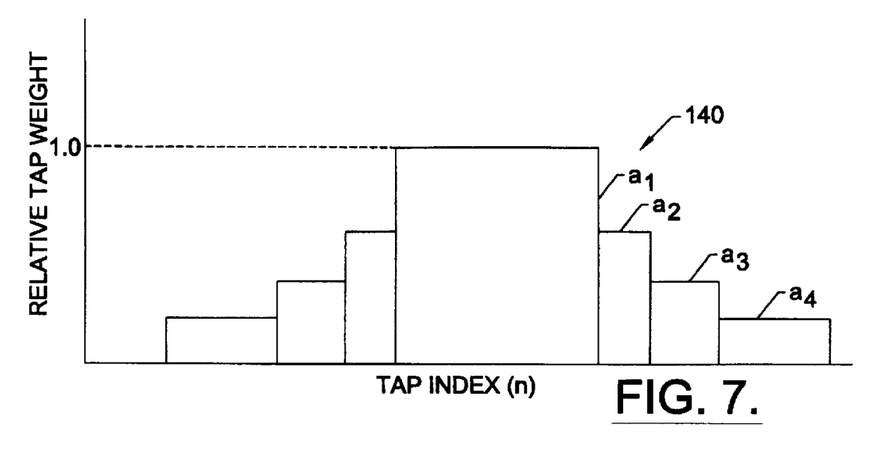
FIG. 7 is a plot illustrating a tap weight function approximation to a Hamming function resulting from series-block weighting alone.
Figure 8:
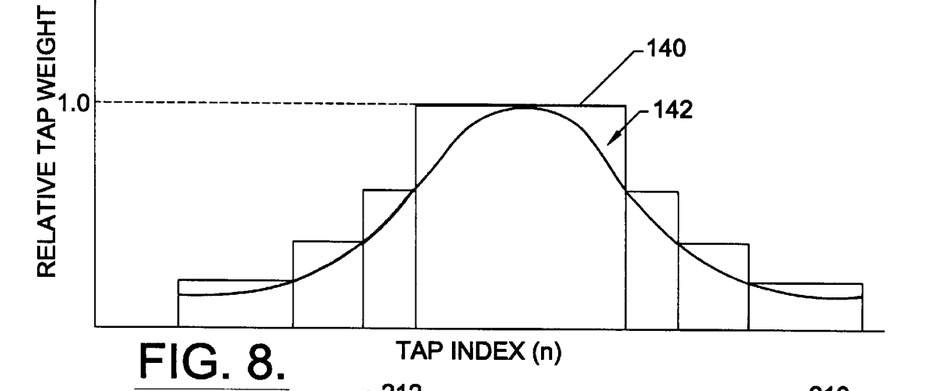
FIG. 8 is a plot illustrating a weighting function resulting from the combination of series-block weighting and line-width weighting.

A plot 140 of the tap weight that can be realized by block weighting is illustrated with reference to FIG. 7. This is an approximation to a Hamming function. Using line-width weighting as herein described, we can reduce the tap weight of each tap within a block or subtransducer by a factor of $m_1$ where $1 \geq m_1 \geq 0.7$ (the value of 0.7 is by way of example only). As a result, the combined series-block weighting and line-width weighting combination 142 is as illustrated with reference to FIG. 8. As can be seen, combined series-block and line-width weighting 142 provides an improved approximation to a desired tap weight function. As a result, frequency sidelobes will be correspondingly lower.

With reference to FIG. 4, in one embodiment of the present invention, electrode fingers of a subtransducer include a finger 84 of narrow width adjacent a finger 88 of relatively larger width. The finger width 84, 88, illustrated here by way of example, and gap 92 are selected as a function of impedance of the source 30 and the load 28, as illustrated with reference to FIG. 1. Such a selection is made to produce mechanically loaded reflections for canceling regenerated waves. With reference again to FIG. 4, there are three electrodes per tap or wavelength (designated by λ in FIG. 4). The number of taps in a subtransducer determines the relative coarse weight of the transducer. Transduction tap strength and reflection tap strength are then further adjusted by varying the electrode finger widths 84, and 88 as shown by way of example again with reference to FIG. 4 for providing a fine line-width weighting mechanism for the subtransducer.

Figure 9:
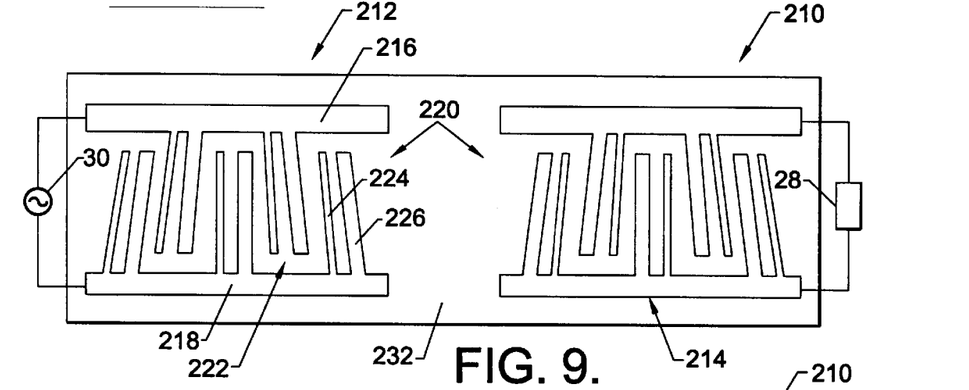
FIG. 9 is a partial plan view of a surface acoustic wave device employing an embodiment of a tapered SPUDT transducer, wherein transducer fingers follow a generally linear pattern in accordance with the present invention
Figure 9A:
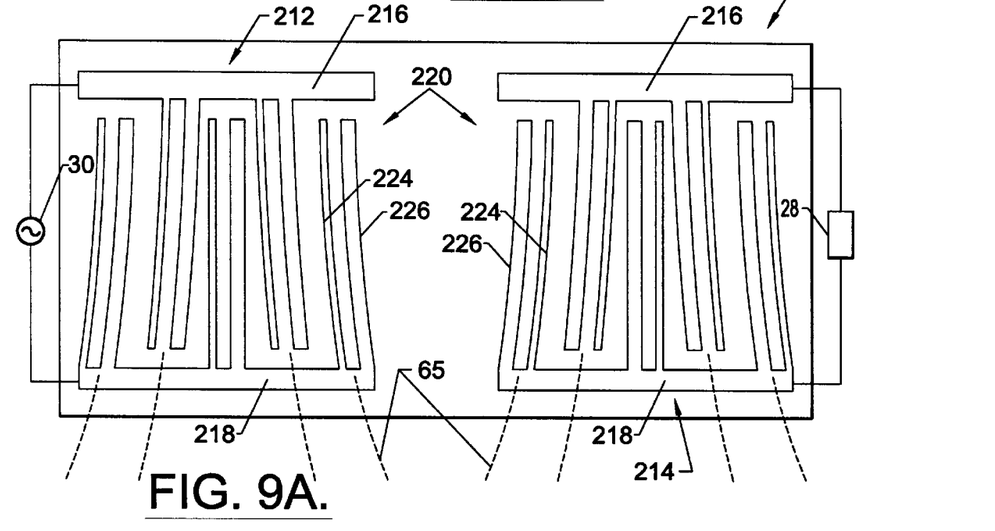
FIG. 9A is a partial plan view of a surface acoustic wave device in an alternate embodiment of FIG. 9, wherein transducer fingers follow a generally hyperbolic curve pattern.
Figure 10:
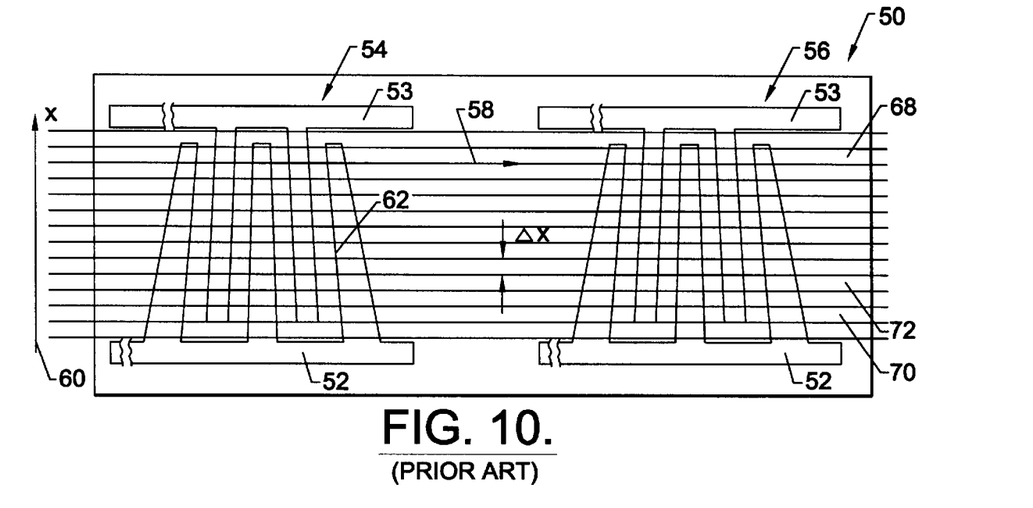
FIG. 10 is a partial plan view of a typical tapered transducer SAW device.
Figure 11:
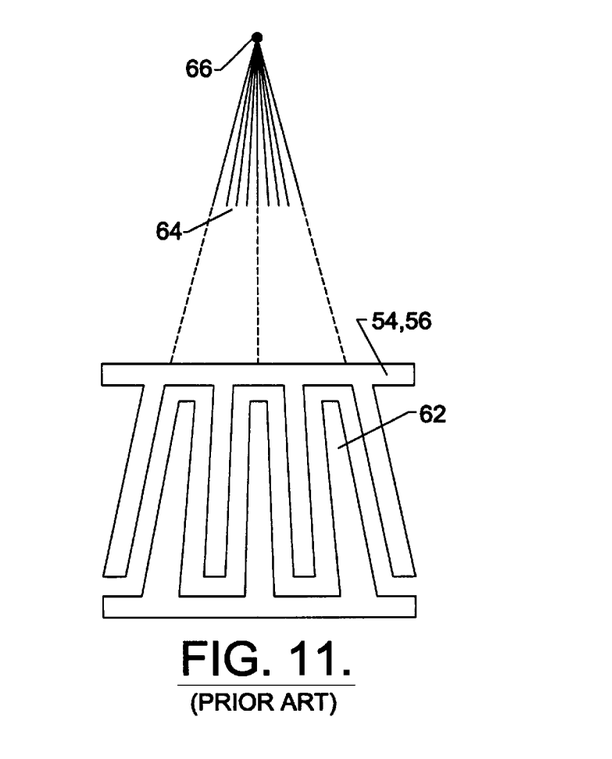
FIG. 11 is a partial plan view of a tapered transducer illustrating tapered finger elements, by way of example, following radial lines emanating from a common focal point.
Figure 12:
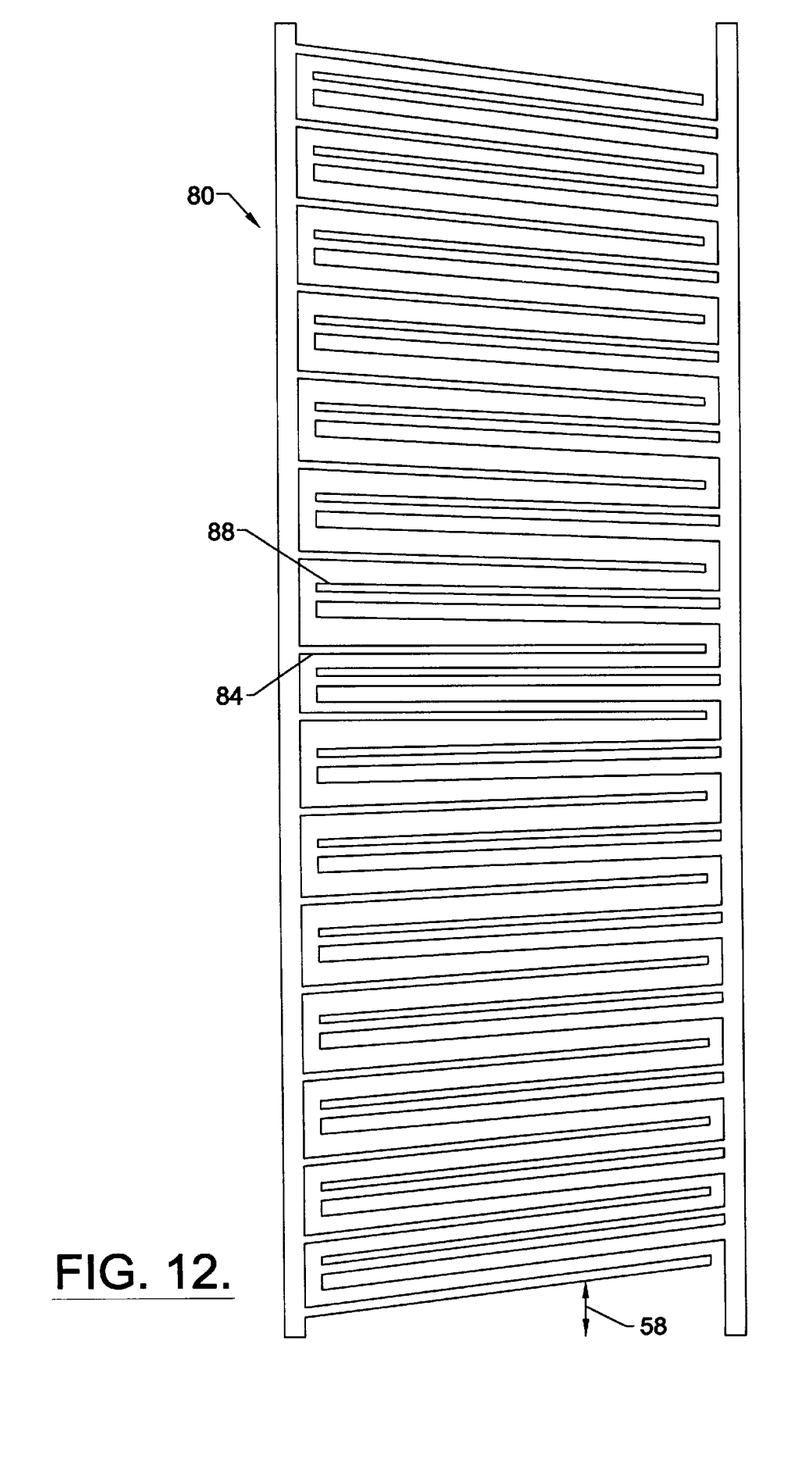
FIG. 12 is a plan view of a transducer illustrating a tapered three electrode per wavelength transducer geometry of an embodiment of the present invention.

Series block weighting and line-width weighting as herein described is also applied to a tapered transducer 80 as illustrated with reference to FIG. 12. Tapered transducers are typically used in pairs, as illustrated with reference to FIGS. 9, 9A, and 10. An input transducer 54 and output transducer 56 in a linear phase filter applications, by way of example, will include each transducer having opposing bus bars 52, 53. Surface wave propagation, as illustrated, by way of example, with reference to SAW device 50 of FIG. 10, is from left to right as shown by the arrow 58. The transverse dimension 60 is here defined as the X direction, and it can be seen that the period of the electrodes or fingers 62 (which defines the wavelength) becomes smaller as X increases. Consequently, the frequency increases with X. As illustrated with reference to FIG. 10, transducer tapered fingers 62 in one embodiment have the fingers 62 tapered along lines 64 which emanate from a single focal point 66 as is the embodiment of FIG. 11. In another embodiment of the present invention, and as illustrated with reference to FIG. 9A, the tapered fingers 220 follow hyperbolically curved lines 65. The high frequencies are detected in the upper portion 68 of the saw aperture, and the lower frequencies in the lower portion 70 of the SAW aperture shown in FIG. 10. There can be two electrodes per wavelength, as earlier described. A variety of other electrode structures may be used. A major constraint imposed on this structure is that, except for taper, every horizontal spacial interval or channel 72 of the transducers 54 should be essentially the same as all other channels 72. In other words, all frequencies within the range of the device, though shifted up or down as the transducer 54 operates, will be excited (or detected) by the same electrode structure.

The frequency response of the tapered transducer is derived from this non-tapered (narrow channel) response by "sliding" the non-tapered response over frequency channel by channel. A consequence of this process is that the better the selectivity of the narrow channel region, the better the selectivity of the tapered transducer. The series-block weighting permits a coarse weighting over a broad range of tap weight values, while the line-width weighting provides a more precise weighting over a continuum weighting, combining for a near zero weight to a maximum normalized weight (e.g. 0–1).

As earlier described in the related application, a tapered SPUDT transducer, by way of example, is configured with four electrodes per wavelength, as illustrated with reference to FIGS. 9 and 9A, and improved further with series-block weighting, as described and illustrated with reference to FIG. 5. Another embodiment includes a tapered three electrode per wavelength geometry, as described and illustrated with reference to FIG. 4, which as described is coarsely weighted using series-block weighting techniques and finely weighted using line-width weighting techniques in combination with the block weighting.

To fully support the claims of the present invention, the following detailed description, supported by the reference application will be provided to present a thorough and complete disclosure.

One embodiment of the present invention, a tapered SPUDT SAW filter device 210 is illustrated and described with reference to FIGS. 9 and 9A. The device 210 comprises input and output transducers 212, 214 with opposing bus bars 216, 218 each having a plurality of interdigitized, continuously tapered electrode fingers 220 configured in finger pairs 222 with each pair having a finger of narrow width 224 adjacent to a finger with a larger or wider width 226, by way of example in the embodiment illustrated. The finger widths 224, 226 are selected as a function of the impedance of a load 28 or source 30 so as to produce mechanical electrical loaded reflections in a substrate 232 upon which the transducers 212, 214 are placed.

Providing an unbalanced split electrode or finger geometry is known in narrow bandwidth SAW filters to successfully cancel reflected waves inherently generated by SAW devices. Such reflected waves lead to triple transit interference. Tapering the electrode fingers in wide bandwidth SAW devices is known to permit the transduction of a wide range of surface acoustic wavelengths. The combination as described herein has the unexpected result of significantly reducing insertion loss and enhancing triple transit suppression, both very much desirable in wide bandwidth SAW filter devices.

In yet another embodiment of a tapered SPUDT transducer, the transducer can be configured with three electrodes per wavelength as illustrated with reference to FIG. 12, and improved further with series block weighting as described and illustrated in a non-tapered version in FIG. 5. The smaller width fingers are illustrated with numeral 123 and the larger width fingers are illustrated with numeral 125, by way of the series block weighted and line width transducer example of FIGS. 2 and 5. As further described herein and as illustrated, again with reference to FIGS. 2 and 5, a plurality of interdigitized electrode fingers 20, 21 extend transversely into the transducer aperture 116 from at least one of the outer 16, 18 and inner 17, 19 bus bars, each electrode finger extending into the aperture and generally across the axis of propagation, as earlier described with reference to numeral 58 of FIG. 10, from its corresponding bus bar, wherein a selected set of fingers and their corresponding bus bars form one subtransducer, 130, 132, 134 by way of example, within a string of subtransducers. Each subtransducer 134L to 134R in FIG. 5, within the string is positioned adjacent each other for providing a transducer acoustic channel 117, and thus an acoustically cascaded series of subtransducers, each subtransducer electrically connected within the series for providing a series-block weighting control to the transducer, and wherein at least some of the electrode fingers have differing width dimensions 123, 125, by way of example, for providing an additional line-width weighting control to the transducer.

Figure 1A:
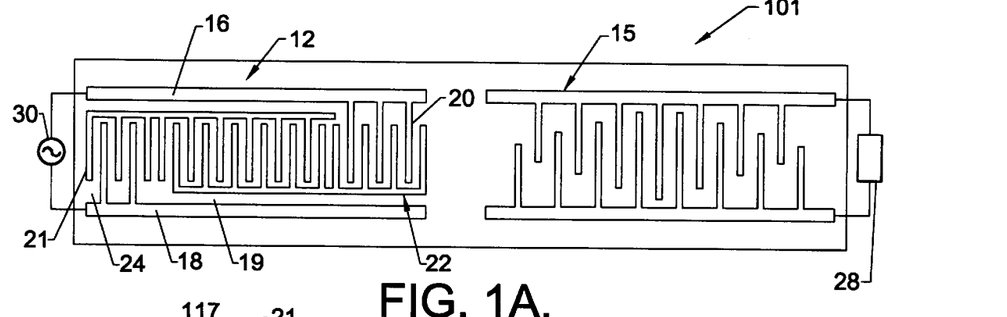
FIG. 1A is a partial plan view of a surface acoustic wave filter employing series block weighting in an input transducer used with an apodized output transducer.

As described with reference to FIG. 1, and supporting illustrations, series block weighting is successfully used for weighting an input transducer 12 used with a similar weighted output transducer 14, configured as a mirror image to each other. Further, because of the uniform weighting across the beam profile, the block weighting transducer 12 having the additional line width weighting, a preferred embodiment of the present invention, is successfully used with an apodized transducer 15, as illustrated with reference to the SAW device 101 of FIG. 1A, typically requiring a receiving transducer having a uniform sampling of the beam across the aperture.

While specific embodiments of the invention have been described in detail herein above, it is to be understood that various modifications may be made from the specific details described herein without departing from the spirit and scope of the invention as set forth in the appended claims.

Having now described the invention, the construction, the operation and use of preferred embodiments thereof, and the advantageous new and useful results obtained thereby, the new and useful constructions, methods of use and reasonable mechanical equivalents thereof obvious to those skilled in the art, are set forth in the appended claims.

What is claimed is:

1. A transducer for a surface acoustic wave device which includes a piezoelectric substrate for propagating surface acoustic waves within an acoustic aperture positioned along a longitudinal axis of propagation across the device, the transducer adapted for coupling to an electrical impedance, the transducer comprising:

outer bus bars defining a transducer aperture for propagating the surface acoustic wave therethrough;

inner bus bars positioned within the transducer aperture; and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a string of subtransducers, each subtransducer within the string positioned adjacent each other for providing a transducer acoustic channel, and thus an acoustically cascaded series of subtransducers, each subtransducer electrically connected within the series for providing a series-block weighting control to the transducer, wherein at least some of the electrode fingers have differing width dimensions for providing an additional line-width weighting control to the transducer, and wherein at least one bus bar has at least two corresponding adjacent electrode fingers extending therefrom, the adjacent fingers distributed within one acoustic wavelength along the propagation axis, each finger of the two adjacent fingers having a different width dimension, the differing electrode finger width dimension selected as a function of impedance for at least one of a source and a load, for producing mechanical electrical loaded reflected acoustic waves in the substrate for canceling regenerated acoustic waves.

2. A transducer according to claim 1, wherein the interdigitized electrode fingers are in a tapering finger alignment, the tapering providing a periodicity of electrode fingers that changes along a direction generally orthogonal to the axis of propagation through the transducer.

3. A transducer according to claim 1, wherein spacing between the electrode fingers along the axis of propagation provides four fingers within a length dimension equal to its respective acoustic wavelength for the transducer.

4. A transducer according to claim 1, wherein three electrode fingers per acoustic wavelength are formed along the propagation axis, and wherein an electrode finger position and width are selected for providing desired reflection and transduction strengths for each tap formed by the electrode fingers.

5. A transducer for a surface acoustic wave device which includes a piezoelectric substrate for propagating surface acoustic waves within an acoustic aperture positioned along a longitudinal axis of propagation across the device, the transducer adapted for coupling to an electrical impedance, the transducer comprising:

outer bus bars defining a transducer aperture for propagating the surface acoustic wave therethrough:

inner bus bars positioned within the transducer aperture: and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a string of subtransducers, each subtransducer within the string positioned adjacent each other for providing a transducer acoustic channel, and thus an acoustically cascaded series of subtransducers, each subtransducer electrically connected within the series for providing a series-block weighting control to the transducer, wherein at least some of the electrode fingers have differing width dimensions for providing an additional line-width weighting control to the transducer, and wherein the interdigitized electrode fingers are in a tapering finger alignment, the tapering providing a periodicity of electrode fingers that changes along a direction generally orthogonal to the axis of propagation through the transducer.

6. A surface acoustic wave filter adapted for coupling to an electrical impedance from at least a source and a load, the device comprising:

an acoustic wave propagating substrate having a surface acoustic wave axis of propagation;

at least one surface acoustic wave transducer positioned on the substrate, the at least one transducer comprising:

opposing outer bus bars defining a transducer acoustic aperture for propagating the surface acoustic wave therethrough;

opposing inner bus bars positioned within the transducer aperture; and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a subtransducer for providing a block weighting control to the transducer, and wherein at least some of the electrode fingers have differing width dimensions for providing an additional weighting control to the transducer;

means for coupling the at least one transducer to an electrical impedance from at least a source and a load; and a second transducer positioned on the substrate for receiving surface acoustic waves generated from the at least one transducer, the second transducer having electrode fingers distributed on the substrate for forming a mirror image of the at least one transducer electrode finger distribution, the at least one transducer cooperating with the second transducer for receiving an electrical signal from the source and providing a signal at the load having a preferred frequency profile.

7. A transducer for a surface acoustic wave device which includes a piezoelectric substrate for propagating surface acoustic waves within an acoustic aperture positioned along a longitudinal axis of propagation across the device, the transducer adapted for coupling to an electrical impedance, the transducer comprising:

outer bus bars defining a transducer aperture for propagating the surface acoustic wave therethrough;

inner bus bars positioned within the transducer aperture; and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a subtransducer for providing a block weighting control to the transducer, wherein at least some of the electrode fingers have differing width dimensions for providing an additional weighting control to the transducer, wherein at least one bus bar has at least two corresponding adjacent electrode fingers extending therefrom, the adjacent fingers distributed within one acoustic wavelength along the propagation axis, each finger of the two adjacent fingers having a different width dimension, the differing electrode finger width dimension selected as a function of impedance for at least one of a source and a load, for producing mechanical electrical loaded reflected acoustic waves in the substrate for canceling regenerated acoustic waves.

8. A transducer according to claim 7, wherein the interdigitized electrode fingers are in a tapering finger alignment, the tapering providing a periodicity of electrode fingers that changes along a direction generally orthogonal to the axis of propagation through the transducer.

9. A transducer according to claim 7, wherein spacing between the electrode fingers along the axis of propagation provides four fingers within a length dimension equal to its respective acoustic wavelength for the transducer.

10. A transducer according to claim 7, wherein three electrode fingers per acoustic wavelength are formed along the propagation axis, and wherein an electrode finger position and width are selected for providing desired reflection and transduction strengths for each tap formed by the electrode fingers.

11. A transducer for a surface acoustic wave device which includes a piezoelectric substrate for propagating surface acoustic waves within an acoustic aperture positioned along a longitudinal axis of propagation across the device, the transducer adapted for coupling to an electrical impedance, the transducer comprising:

outer bus bars defining a transducer aperture for propagating the surface acoustic wave therethrough;

inner bus bars positioned within the transducer aperture; and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a subtransducer for providing a block weighting control to the transducer, wherein at least some of the electrode fingers have differing width dimensions for providing an additional weighting control to the transducer, and wherein the interdigitized electrode fingers are in a tapering finger alignment, the tapering providing a periodicity of electrode fingers that changes along a direction generally orthogonal to the axis of propagation through the transducer.

12. A surface acoustic wave filter adapted for coupling to an electrical impedance from at least a source and a load, the device comprising:

an acoustic wave propagating substrate having a surface acoustic wave axis of propagation;

at least one surface acoustic wave transducer positioned on the substrate, the at least one transducer comprising:

opposing outer bus bars defining a transducer acoustic aperture for propagating the surface acoustic wave therethrough;

opposing inner bus bars positioned within the transducer aperture; and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a subtransducer for providing a block weighting control to the transducer, and wherein at least some of the electrode fingers have differing width dimensions for providing an additional weighting control to the transducer;

means for coupling the at least one transducer to an electrical impedance from at least a source and a load; and a second transducer having an apodized electrode finger configuration, the second transducer cooperating with the at least one transducer for receiving an electrical signal from the source and providing a signal at the load having a preferred frequency profile.

13. A surface acoustic wave filter adapted for coupling to an electrical impedance from at least a source and a load, the device comprising:

an acoustic wave propagating substrate having a surface acoustic wave axis of propagation;

at least one surface acoustic wave transducer positioned on the substrate, the at least one transducer comprising:

opposing outer bus bars defining a transducer acoustic aperture for propagating the surface acoustic wave therethrough;

opposing inner bus bars positioned within the transducer aperture; and a plurality of interdigitized electrode fingers extending transversely into the aperture from at least one of the outer and inner bus bars, each electrode finger extending into the aperture and generally across the axis of propagation from its corresponding bus bar, wherein a selected set of fingers and their corresponding bus bars form a subtransducer for providing a block weighting control to the transducer, and wherein at least some of the electrode fingers have differing width dimensions for providing an additional weighting control to the transducer, wherein the at least one transducer includes at least one bus bar having at least two corresponding adjacent electrode fingers extending therefrom, the adjacent fingers distributed within one acoustic wavelength along the propagation axis, each finger of the two adjacent fingers having a different width dimension, the differing electrode finger width dimension selected as a function of impedance for at least one of a source and a load, for producing mechanical electrical loaded reflected acoustic waves in the substrate for canceling regenerated acoustic waves; and means for coupling the at least one transducer to an electrical impedance from at least a source and a load.

14. A filter according to claim 13, wherein spacing between the electrode fingers along the axis of propagation provides four fingers within a length dimension equal to its respective acoustic wavelength for the at least one transducer.

15. A transducer according to claim 14, wherein first and third fingers of the at least one transducer have a width of $1/16$ the acoustic wavelength and second and fourth fingers have a width of $3/16$ the wavelength and wherein adjacent fingers are separated by a gap of $1/8$ the wavelength.

16. A transducer according to claim 13, wherein three electrode fingers per acoustic wavelength are formed along the propagation axis, and wherein an electrode finger position and width are selected for providing desired reflection and transduction strengths for each tap formed by the electrode fingers of the at least one transducer.

* * * * *